United States Patent
Sakano et al.

(10) Patent No.: US 7,259,497 B2
(45) Date of Patent: Aug. 21, 2007

(54) VIBRATION WAVE MOTOR

(75) Inventors: Hiromichi Sakano, Tokyo (JP); Yasuo Sasaki, Tokyo (JP)

(73) Assignee: Olympus Corporation, Tokyo (JP)

( * ) Notice: Subject to any disclaimer, the term of this patent is extended or adjusted under 35 U.S.C. 154(b) by 42 days.

(21) Appl. No.: 11/201,734

(22) Filed: Aug. 11, 2005

(65) Prior Publication Data
US 2006/0049719 A1    Mar. 9, 2006

(30) Foreign Application Priority Data
Sep. 7, 2004    (JP) .............................. 2004-259356

(51) Int. Cl.
*H01L 41/08* (2006.01)
(52) U.S. Cl. ................................ 310/323.02
(58) Field of Classification Search .......... 310/328, 310/323.02, 323.03
See application file for complete search history.

(56) References Cited

U.S. PATENT DOCUMENTS

| | | | | |
|---|---|---|---|---|
| 5,136,200 A | * | 8/1992 | Takizawa et al. ...... | 310/323.16 |
| 5,696,421 A | * | 12/1997 | Zumeris et al. ............. | 310/328 |
| 6,396,194 B1 | * | 5/2002 | Iino et al. .............. | 310/323.16 |
| 6,747,394 B2 | * | 6/2004 | Johansson et al. ..... | 310/323.02 |
| 6,765,335 B2 | * | 7/2004 | Wischnewskiy ....... | 310/323.02 |
| 7,109,639 B2 | * | 9/2006 | Yamamoto et al. .... | 310/323.16 |

FOREIGN PATENT DOCUMENTS

JP    H09-051687    2/1997

* cited by examiner

*Primary Examiner*—Mark Budd
(74) *Attorney, Agent, or Firm*—Scully, Scott, Murphy & Presser, P.C.

(57) ABSTRACT

The vibration wave motor of the present invention comprises a body to be driven, and a plurality of vibrators each of which is provided with a drive contact part contacting the outer surface of the body to be driven, is connected to a base and is disposed around the body to be driven. The base and the body to be driven are reciprocally driven linearly in a state where the longitudinal direction of the vibrator and the driven direction of the body to be driven are matched.

2 Claims, 12 Drawing Sheets

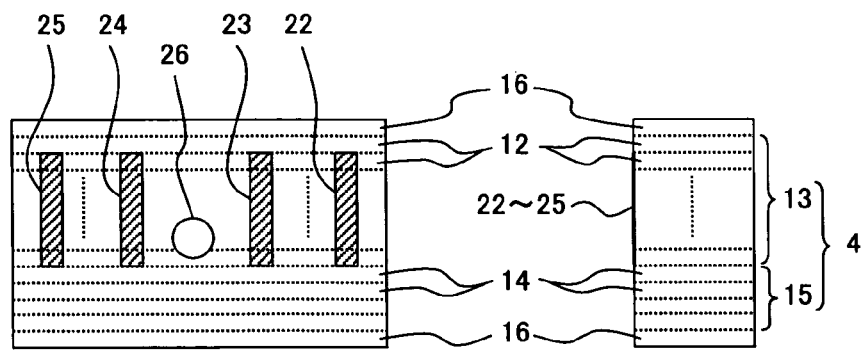
F I G. 2A    F I G. 2B
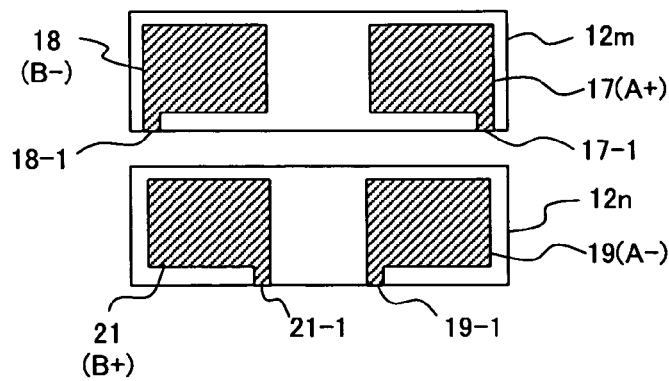
F I G. 2C
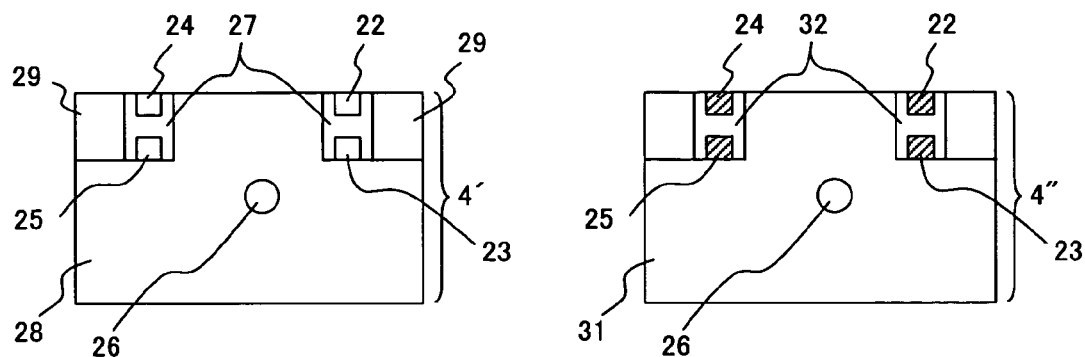
F I G. 2D    F I G. 2E

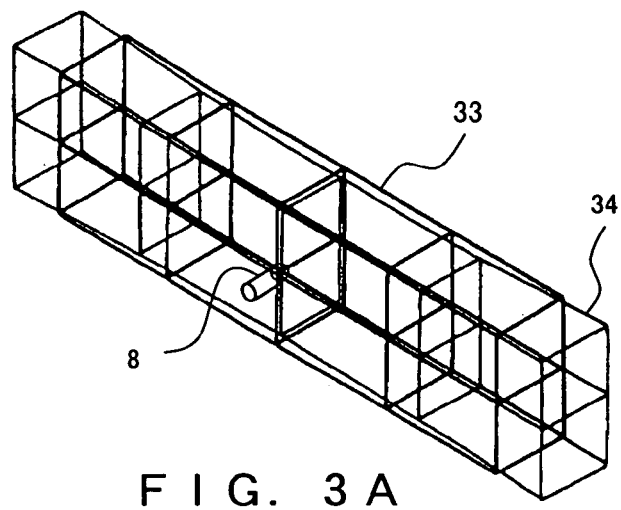
F I G. 3A
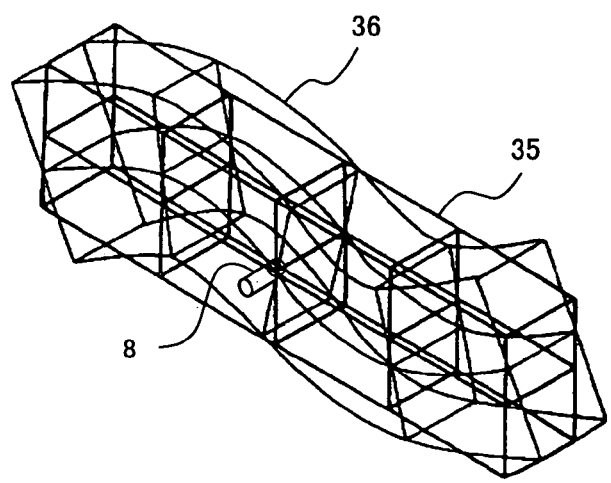
F I G. 3B
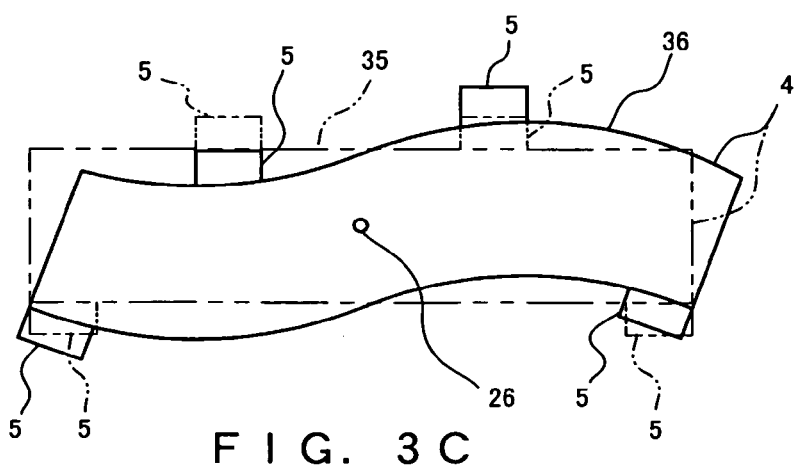
F I G. 3C

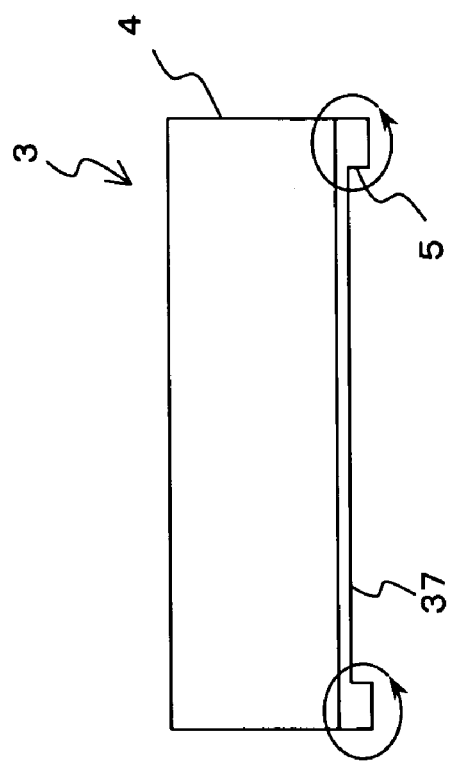
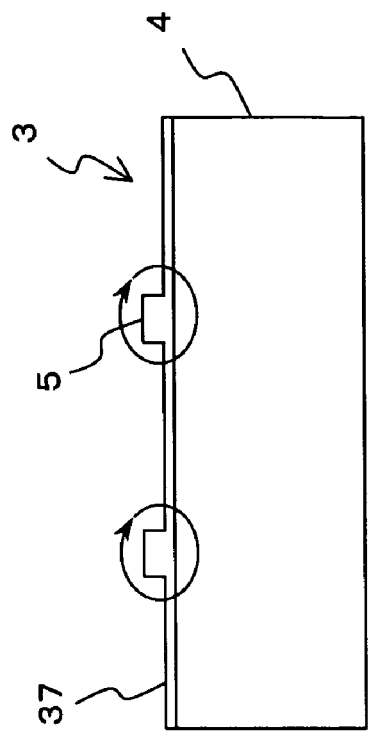
FIG. 4A
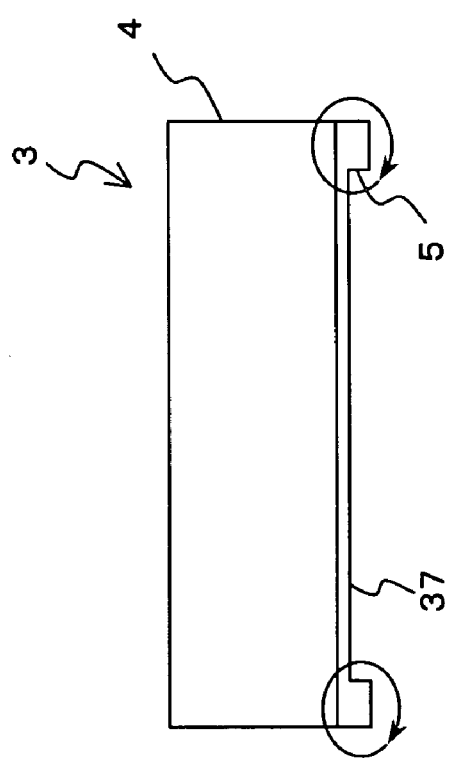
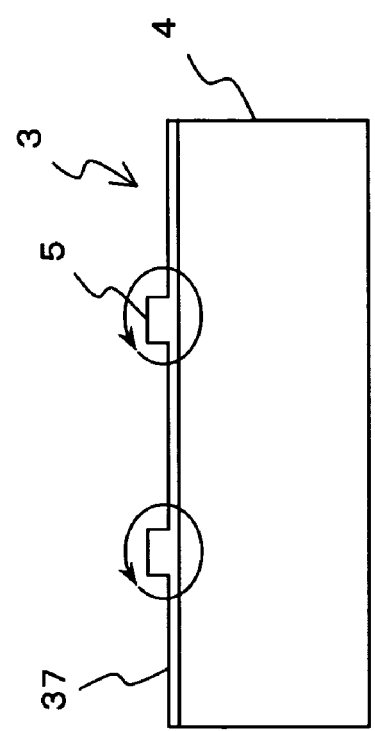
FIG. 4B

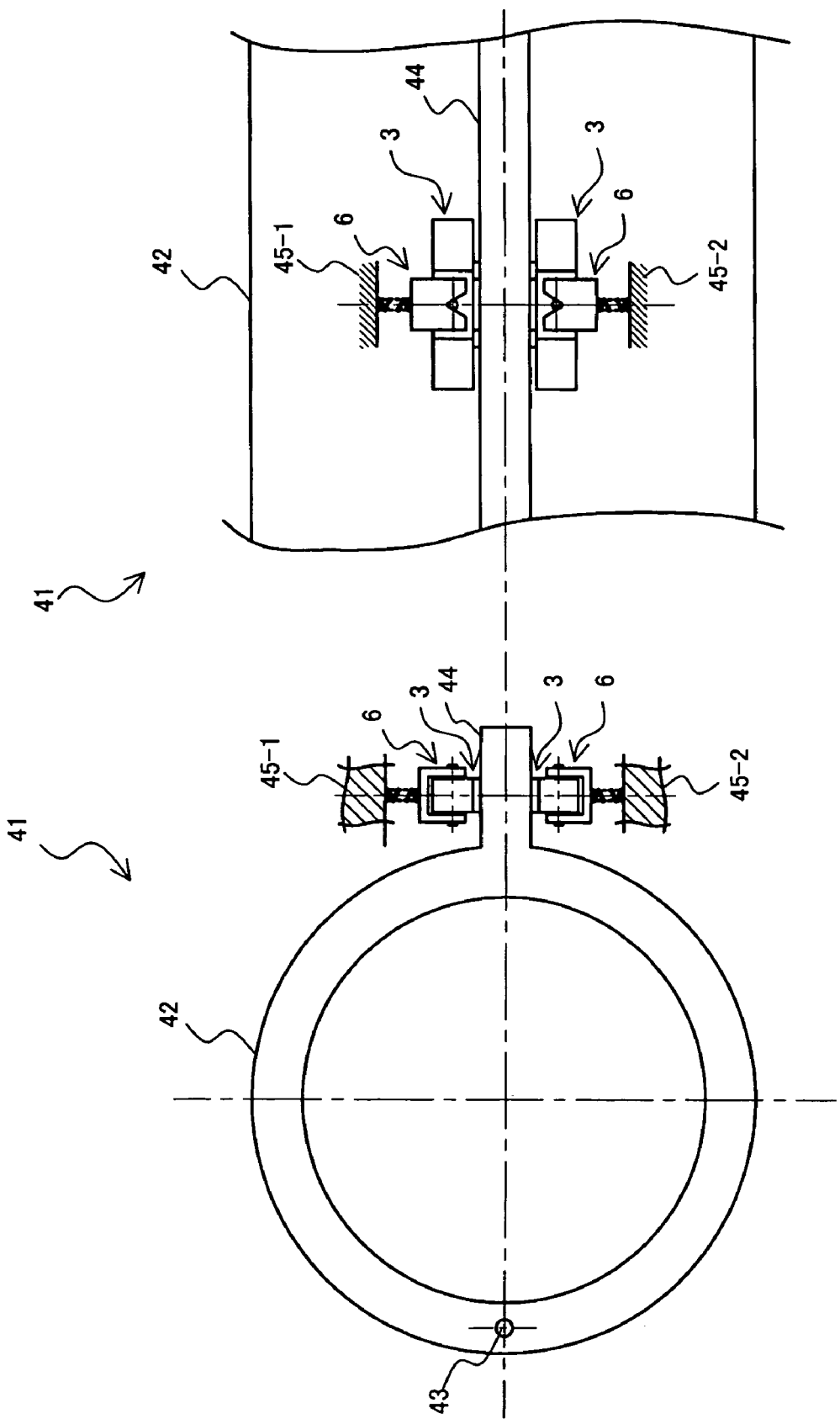

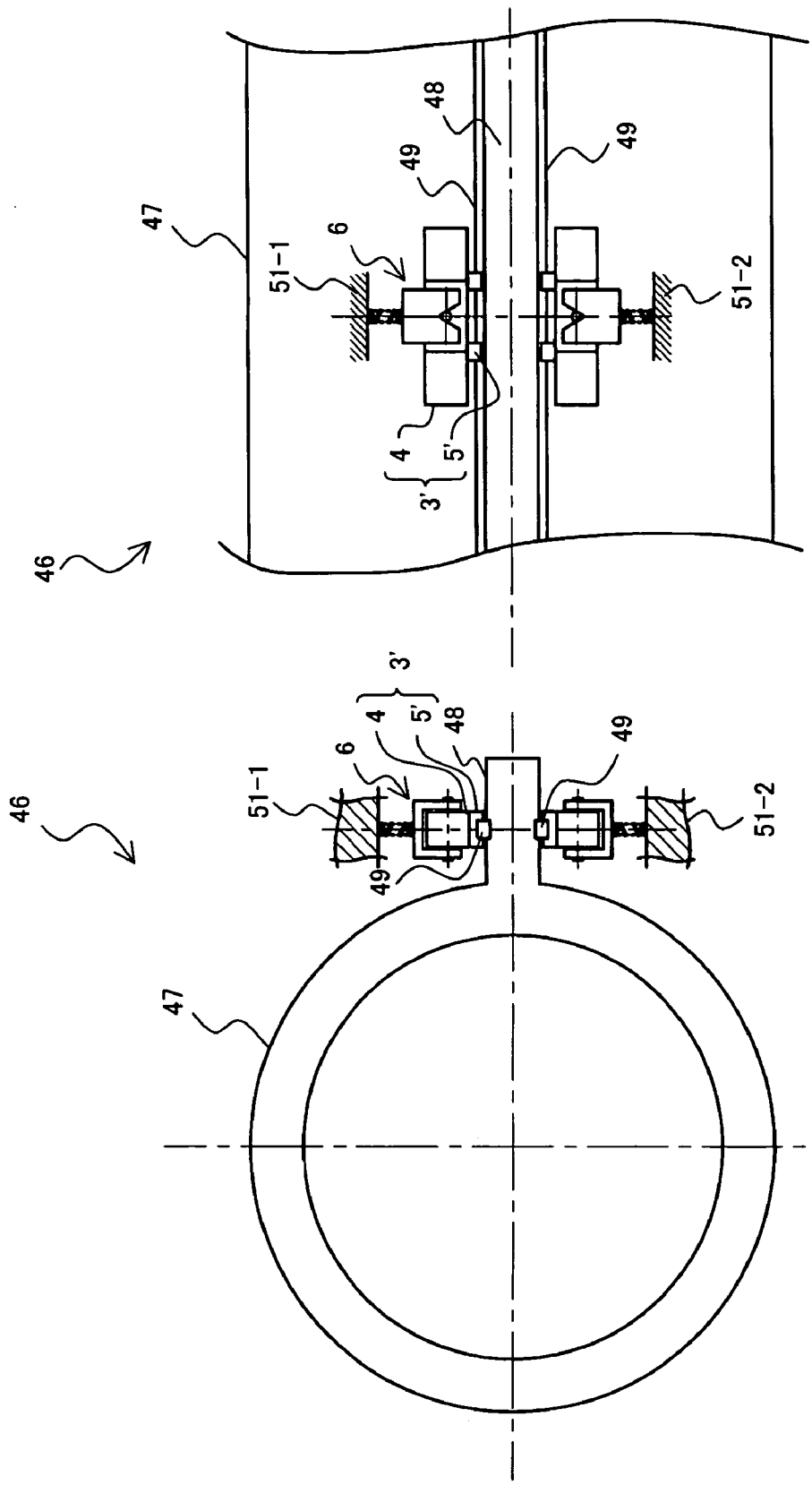

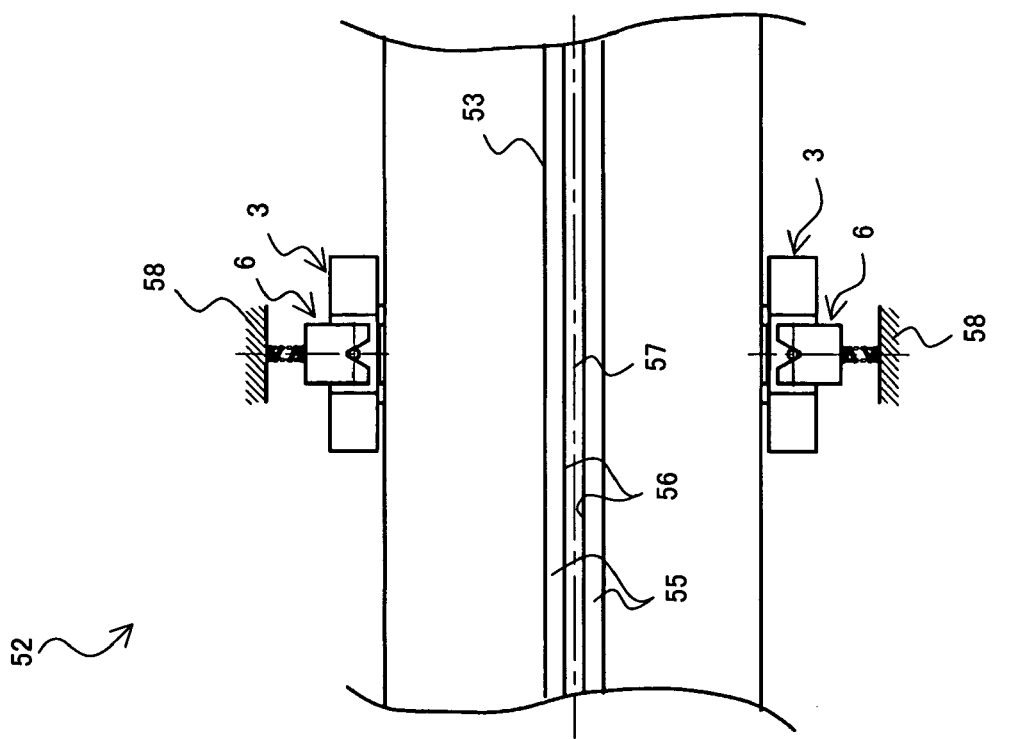
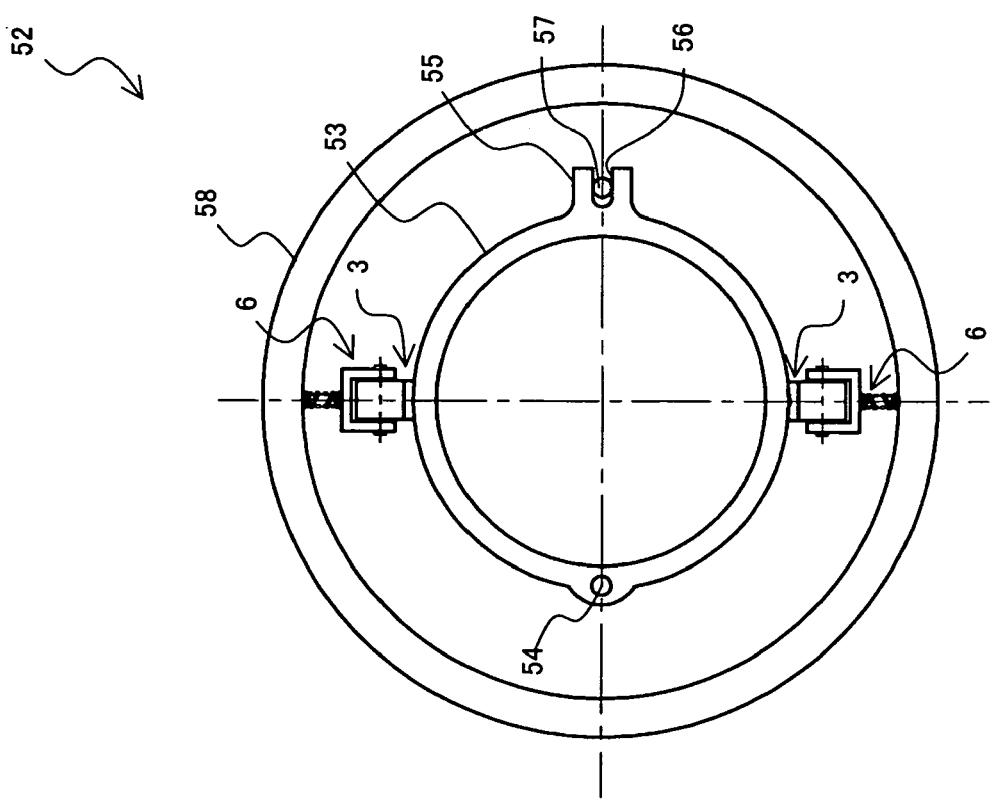
FIG. 10B
FIG. 10A

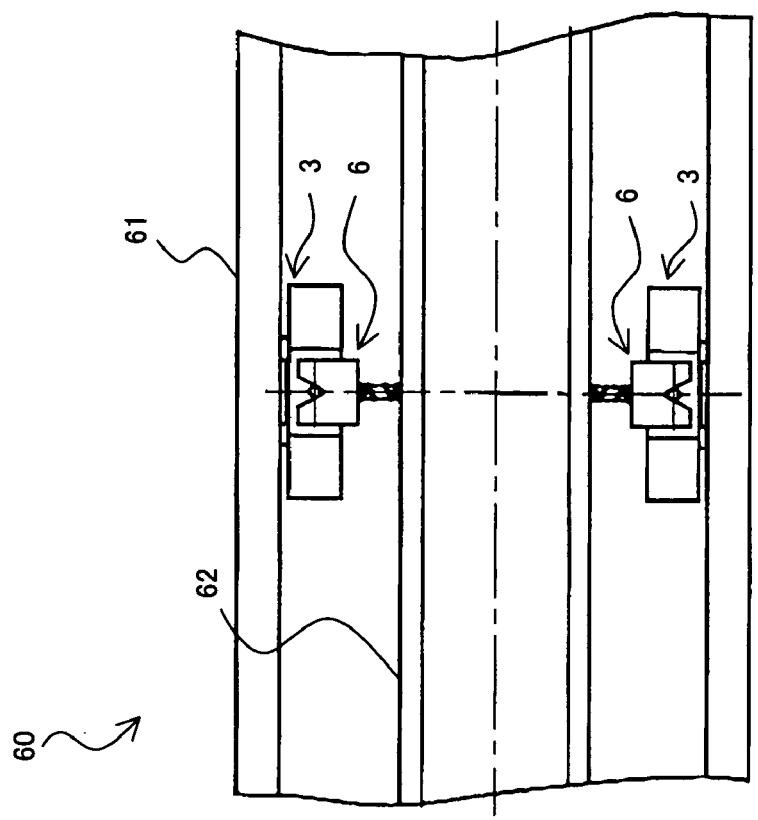
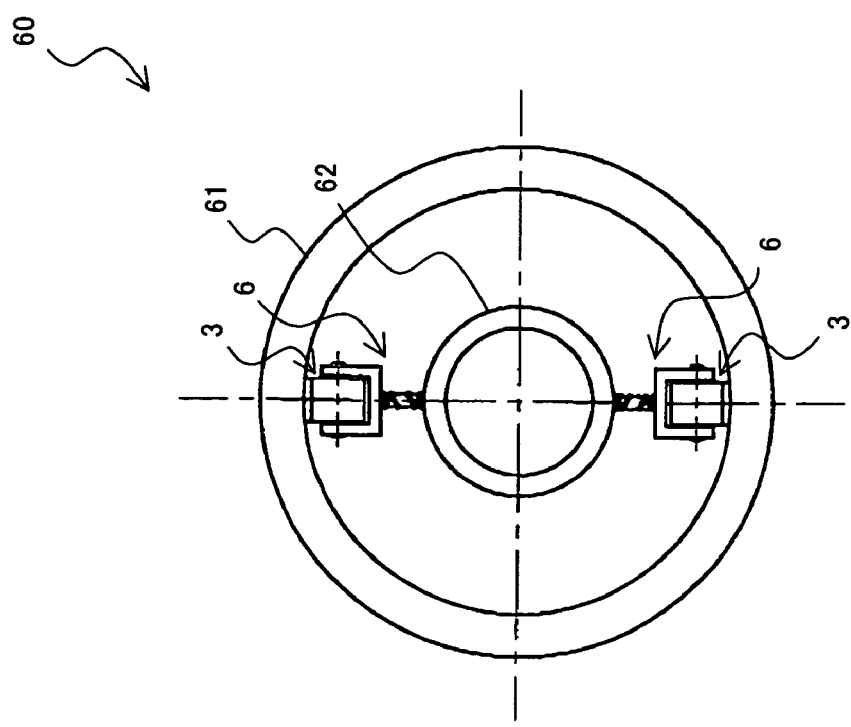

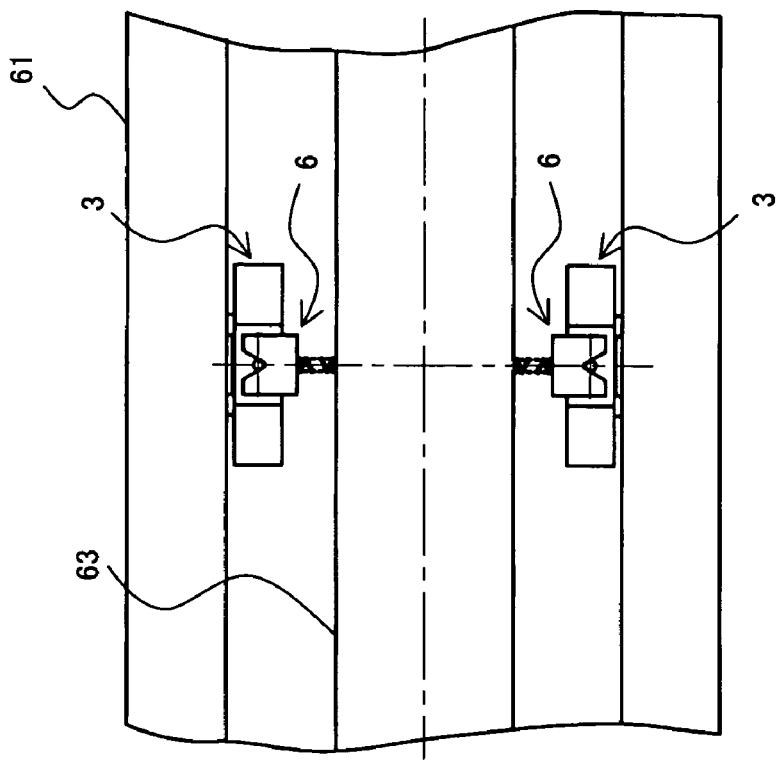
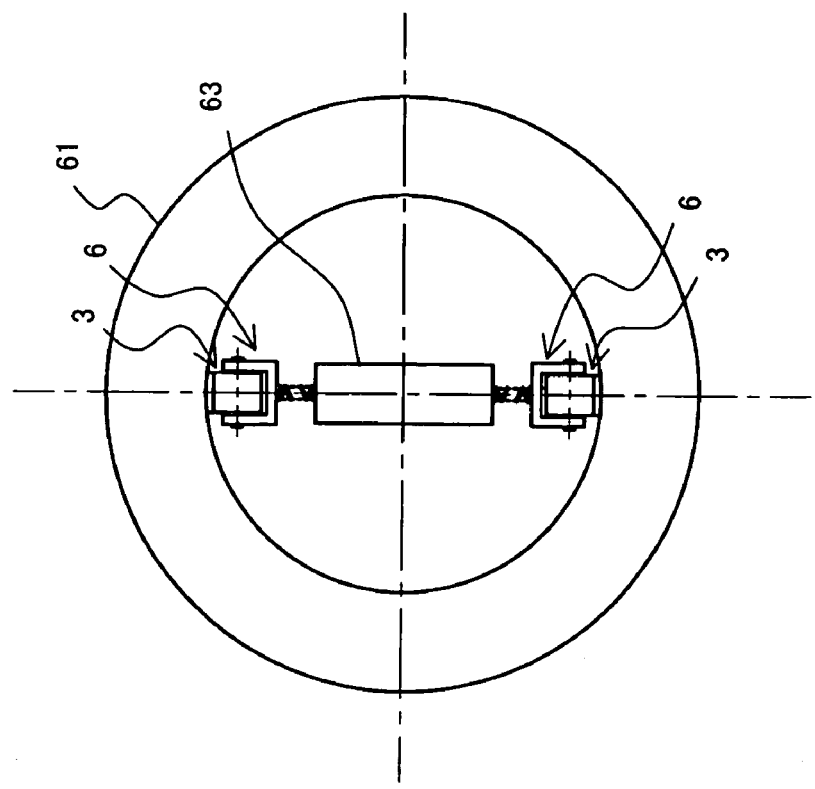
FIG. 12A
FIG. 12B

VIBRATION WAVE MOTOR

CROSS REFERENCE TO RELATED APPLICATIONS

This application is based upon and claims the benefit of priority from the prior Japanese Patent Application No. 2004-259356, filed Sep. 7, 2004, the entire contents of which are incorporated herein by reference.

BACKGROUND OF THE INVENTION

1. Field of the Invention

The present invention relates to a vibration wave motor for performing linear drive using a ultrasonic wave vibrator, and more particularly, relates to a vibration motor miniaturized by employing a simple structure.

2. Description of the Related Art

Recently the ultrasonic wave motor (vibration wave motor) is observed, as a new motor to be replacing the electromagnetic motor.

Compared with a conventional electromagnetic motor such a ultrasonic wave motor offers the following advantages.

(1) Low-speed high-driving force can be obtained without any gearing.
(2) It has a large holding force.
(3) It has a long stroke and high resolution.
(4) It operates quietly.
(5) It causes no magnetic noise and is also not affected by noise.

As a conventional ultrasonic wave motor having such advantages, a linear ultrasonic wave motor whose moving part is provided with two vibrator plates, in which one guide shaft is inserted between each pair of opposed projected parts formed on the opposed surfaces of each vibrator plate and whose moving part moves along the guide shaft as a result of the vibration of the two vibrator plates is proposed (for example, see Japanese Patent Application No. H09-051687, paragraphs [0011]-[0012] and FIG. 1).

SUMMARY OF THE INVENTION

The vibration wave motor of the present invention comprises a body to be driven and a plurality of vibrators each of which is provided with a drive contact part for contacting the outer surface of the body to be driven is connected to a base and is disposed around the body to be driven. The base and body to be driven are linearly driven relative to one another in a state where the longitudinal direction of the vibrator and the driven direction of the body to be driven are matched.

BRIEF DESCRIPTION OF THE DRAWINGS

FIG. 2A is the front view of the vibrator main body of a vibration wave linear motor.

FIG. 2B is the side view of the vibration wave motor shown in FIG. 2A.

FIG. 2C shows the locations of the piezoelectric sheet and electrodes of the vibrator main body shown in FIGS. 2A and 2B.

FIGS. 2D and 2E show two examples of the structure of the vibrator main body.

FIGS. 3A and 3B are perspective views for explaining typical ultrasonic wave elliptic vibrations of the vibrator main body of the vibration wave linear motor vibrated and driven by the voltage applied to the electrodes.

FIG. 3C simply explains the secondary curvature vibration of FIG. 3B, using only the outline of the vibrator main body.

FIGS. 4A and 4B show typical elliptic vibrations of the drive contact part of the vibrator caused when alternating voltages with different frequencies in the vicinity of a resonant frequency, whose phases are different by π/2 are applied.

FIG. 8A is the front view of the vibration wave motor in the fifth preferred embodiment.

FIG. 8B is the side view of the vibration wave motor shown in FIG. 8A.

FIG. 9A is the front view of the vibration wave motor in the sixth preferred embodiment.

FIG. 9B is the side view of the vibration wave motor shown in FIG. 9A.

FIG. 10A is the front view of the vibration wave motor in the seventh preferred embodiment.

FIG. 10B is the side view of the vibration wave motor shown in FIG. 10A.

FIG. 11A is the front view of the vibration wave motor in the eighth preferred embodiment.

FIG. 11B is the side view of the vibration wave motor shown in FIG. 11A.

FIG. 12A is the front view of the vibration wave motor in a variation of the eighth preferred embodiment.

FIG. 12B is the side view of the vibration wave motor shown in FIG. 12A.

DESCRIPTION OF THE PREFERRED EMBODIMENTS

The preferred embodiments of the present invention are described below with reference to the drawings.

The First Preferred Embodiment

Figure 1B:
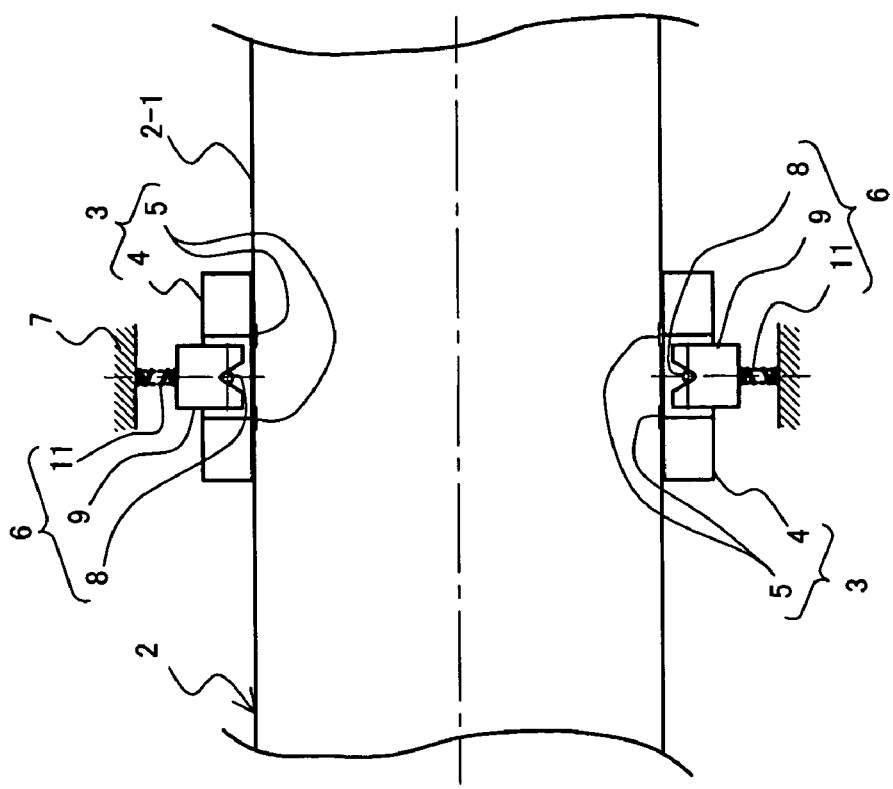
FIG. 1B is the side view of the vibration wave motor shown in FIG. 1A.
Figure 1A:
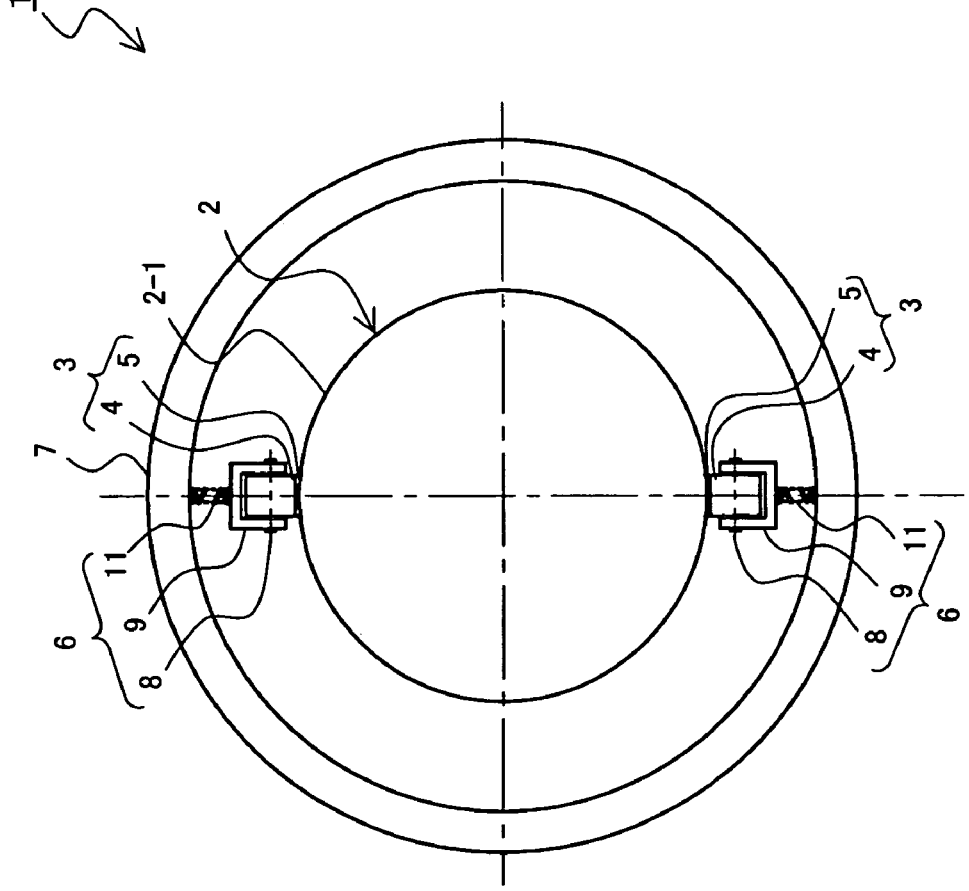
FIG. 1A is the front view of the vibration wave motor in the first preferred embodiment.

FIG. 1A is the front view of the vibration wave motor in the first preferred embodiment, and FIG. 1B is its side view. As shown in FIGS. 1A and 1B, this vibration wave motor 1 comprises a cylindrical body to be driven 2 and a plurality of (two in FIGS. 1A and 1B) vibrators 3 disposed around the body to be driven.

Each of the vibrators 3 comprises a vibrator main body 4 and a drive contact part 5 fixed on the vibrator main body, for contacting the outer surface 2-1 of the body to be driven, each of which is connected to a base 7 via a connecting part 6. The connecting part 6 comprises a pin member 8, a holding member 9 and a pushing member 11.

The pin member 8 is inserted and fixed through a position which becomes the vibration node of the vibrator main body 4, and each externally projected end of it engages with the trough of a groove cut in the shape of a character V into each side of the holding member 9 with a section in the shape of a Japanese character ⊐(katakana "ko").

The pushing member 11 inserted between the holding member 9 and the base 7, pushes the holding member 9 toward the body to be driven 2.

Thus, the vibrator 3 is pushed against the outer surface 2-1 of the body to be driven 2 by being pushed via the trough of the V character-shaped groove of the holding member 9 and pin member 8. In other words, the body to be driven 2 and the vibrator 3 are reciprocally pressed.

In this vibration wave motor 1, the vibrator 3 reciprocally drives the base 7 and body to be driven 2 linearly in a state where the longitudinal direction of the vibrator 3 (perpendicular to the paper in FIG. 1A, the left/right direction of the drawing in FIG. 1B) and the driven direction of the body to be driven 2 are matched.

Next, the structure of the vibrator main body 4 of the vibration wave motor 1 in this preferred embodiment is described below.

FIG. 2A is the front view of the vibrator main body 4 of a vibration wave linear motor. FIG. 2B is its side view. FIG. 2C shows the locations of the piezoelectric sheet and electrodes of the vibrator main body 4 shown in FIGS. 2A and 2B. FIGS. 2D and 2E show two examples of other structures of the vibrator main body.

As shown in FIGS. 2A and 2B, the vibrator main body 4 comprises a piezoelectric sheet layer 13 composed of layered piezoelectric sheets 12 and an elastic sheet layer 15 composed of elastic sheets 14 layered beneath it.

A dielectric sheet 16 is pasted on the top surface of the piezoelectric sheet layer 13 and on the bottom surface of the elastic sheet layer 15.

In this case, as the dielectric sheet 16, the same member as the elastic sheet 14, being originally dielectric can also be used.

The drive contact part 5 shown in FIG. 1A or 1B is formed in such a way as to be firmly fixed each outer surface of one of the dielectric sheets 16.

The piezoelectric sheet layer 13 of the vibrator main body 4 constitutes a piezoelectric part for mainly generating forced vibration. The elastic sheet layer 15 constitutes an excitation part for exciting a specific vibration mode together with the piezoelectric part.

However, if only the piezoelectric part can excite a desired vibration mode, the excitation part is not always necessary.

The piezoelectric sheet 12 constituting the piezoelectric sheet layer 13 differs from the elastic sheet 14 of the elastic sheet layer 15 in whether an internal electrode treatment is applied. Essentially, they are thin rectangular sheet members made of the same material, such as lead titanate/zirconate (PZT) or the like.

Specifically, this sheet member measures, for example, 10 mm long, 2.5 mm deep and 80 μm high (thickness in the layered direction).

As the PZT material used in this preferred embodiment, a hard material with a large Qm value of 2000 is selected. This also applies to the elastic sheet.

The dielectric sheet 16 vertically sandwiching and holding the piezoelectric sheet layer 13 and elastic sheet layer 15 is made of the same PZT material, and is 40 μm thick.

Although these dielectric sheets-16 are made of the same material as the piezoelectric sheet 12, they have no polarity and are not piezoelectric, since no electrodes are provided. Therefore, they substantially have the characteristics of an insulator.

The piezoelectric sheet 12 of the piezoelectric sheet layer 13 comprises two types of sheet piezoelectric devices which differ from each other only in the pattern of electrodes to which an internal electrode treatment is applied.

As shown in FIG. 2C, one of the two types of piezoelectric sheets 12 is a piezoelectric sheet 12m which is divided into two parts, left and right, in one of which A+ internal electrode foil 17 is almost entirely formed and the other of which B− internal electrode foil 18 is almost entirely formed.

Almost at the right and left ends of the A+ internal electrode foil 17 and B− internal electrode foil 18, terminals 18-1 and 17-1, respectively, are formed and projected on one side of the piezoelectric sheet 12m for external connection.

The other of the two types of piezoelectric sheets 12 is a piezoelectric sheet 12n which is similarly divided into two parts, left and right, in one of which A− internal electrode foil 19 is almost entirely formed and the other of which B+ internal electrode foil 21 is almost entirely formed.

Almost at the left and right ends of the A− internal electrode foil 19 and B+ internal electrode foil 21 near the center of the piezoelectric sheet, terminals 19-1 and 21-1, respectively, for external connection are similarly projected and formed on one side of the piezoelectric sheet 12n.

As the electrode material of the internal electrode foil, silver-palladium alloy or silver is used. They are formed 4 μl thick, for example, by evaporation and photolithography technology.

In this preferred embodiment, the piezoelectric sheet layer 13 is constituted by alternately piling 24 piezoelectric sheets 12m and 24 piezoelectric sheets 12n, that is 48 sheets as a total.

In this way, in the middle layer, excluding the top and bottom, the internal electrodes for applying opposite potentials to a piezoelectric sheet 12 (12n or 12m) in which one internal electrode foil is formed and a piezoelectric sheet 12 (12m or 12n) which contacts with the other piezoelectric sheet are formed.

The terminals for external connection, 17-1, 18-1, 19-1 and 21-1 formed and projected from the A+ internal electrode foil 17, A− internal electrode foil 19, B+ internal electrode foil 21 and B− internal electrode foil 18 on one side of piezoelectric sheets 12 (12m and 12n) are connected to the A+ electrode connection external terminal 22, A− electrode connection external terminal 23, B+ electrode connection external terminal 24 and B− electrode connection external terminal 25, respectively, which are made of printed silver on one side of the vibrator main body shown in FIG. 2A.

The A+ electrode connection external terminal 22 and A− electrode connection external terminal 23 constitute a phase A electrodes, and the B+ electrode connection external terminal 24 and B− electrode connection external terminal 25 constitute a phase B electrodes.

In this case, since the A− electrode connection external terminal 23 and B− electrode connection external terminal 25 are constituted for phase A and phase B ground (GND) connections, respectively, they can also be connected to the same lead wire or the like and the potentials can also be made electrically the same.

Voltage is applied to the piezoelectric sheet layer 13 from a driving circuit, which is not shown in FIG. 2, via the phase A and phase B electrode connection external terminals, and the vibrator main body 4 causes a ultrasonic wave elliptic vibration, which is described later.

The vibrator main body 4 of this preferred embodiment for example, measures 10 mm long, 2 mm deep and 2.5 mm high.

As shown in FIG. 2A, in this vibrator main body 4, the fixing hole 26 for the pin member 8 shown in FIG. 1A or 1B is formed almost midway between the phase A electrode and phase B electrode, that is, at the center, which becomes a vibration node as described later.

As the piezoelectric portion, the followings can also be used instead of the piezoelectric sheet layer 13.

FIG. 2D shows the structure of the vibrator main body 4 obtained by bonding and combining a piezoelectric material 27 made of layered piezoelectric materials or piezoelectric materials as a piezoelectric part, a vibrator main body major part 28 made of, for example, brass, and vibrator main body parts 29. In this case, the vibrator main body major part 28 and vibrator main body parts 29 constitute the excitation part.

FIG. 2E shows the structure of a vibrator main body 4″ obtained by bonding a thin single piezoelectric material 32 to a rectangular parallelepiped elastic part 31, for example, made of brass. In this case, the elastic part 31 constitutes the excitation part.

In order to improve vibration efficiency, it is important to bond these members with sufficient pressure when bonding them.

FIGS. 3A and 3B are perspective views for explaining typical ultrasonic wave elliptic vibrations of the vibrator main body 4 of the vibration wave linear motor 1 vibrated and driven by the voltage applied to the electrodes in the above-described structure. FIG. 3C simply explains the secondary curvature vibration of FIG. 3B, using only the outline of the vibrator main body.

Firstly, if alternating voltages with the same phase and different frequencies in the vicinity of a resonant frequency are applied to the phase A electrodes 22 and 23, and phase B electrodes 24 and 25 of the vibrator main body 4 shown in FIG. 2A, as shown in FIG. 3A, the vibrator main body 4 excites primary vertical vibration composed of a stationary position 33 and a resonant vertical vibration position 34. In this case, the vibrator main body 4 expands/contracts longitudinally and also the vertical and horizontal dimensions of the center expand/contract.

If in FIG. 2A, alternating voltages with the opposite phases and different frequencies in the vicinity of a resonant frequency are applied to the phase A electrodes 22 and 23, and phase B electrodes 24 and 25 as shown in FIG. 3B, the vibrator main body 4 excites a secondary curvature vibration composed of a stationary position 35 and a resonant curvature vibration position 36.

Although these vibrations can be predicted by applying computer analysis using the finite element method, the result of an actual ultrasonic wave vibration measurement also verifies the prediction.

FIG. 3C also shows the movement of the two drive contact parts 5 disposed on the vibrator main body 4 with the structure shown in FIG. 1A or 1B in addition to the stationary position 35 and resonant curvature vibration position 36 in the upper section, and shows the movement of the two drive contact parts 5 in the case where the two drive contact parts 5 are disposed at each end in the longitudinal direction of the vibrator main body 4.

FIGS. 3A and 3B show the pin member 8 fixed through the pin member fixing hole 26 formed at the center position, which becomes the vibration node (position of the node where vibration becomes a minimum) shown in FIG. 3C, which is shown in FIGS. 2A, 2D and 2E.

As described above, in order to efficiently convey power from a vibrator to a body to be driven, it is preferable to dispose and fix the drive contact part in a position where vibration in the opposing direction of the body to be driven of the vibrator becomes the highest or its vicinity.

In this preferred embodiment, the resonant frequency is designed in such a way that the resonant frequency of the secondary curvature vibration becomes lower than the resonant frequency of the primary vertical vibration by approximately several percent (preferably 3%).

Thus, the linear output characteristic of the vibration wave motor can be greatly improved.

Next, if alternating voltages with different frequencies in the vicinity of a resonant frequency, whose phases are different by $\pi/2$ are applied to the phase A electrodes 22 and 23 and phase B electrodes 24 and 25 of the vibrator main body 4, an elliptic vibration can be observed in the position of the two drive contact parts 5 disposed at each end in the longitudinal direction of the vibrator main body 4 shown in FIG. 3C and in the position of the two drive contact parts 5 disposed almost midway between each end and the center of the vibrator main body 4 as shown in FIG. 3C.

In this case, the rotation direction of the elliptic vibration caused by ultrasonic wave vibration at the position of the drive contact part 5 at the bottom of the vibrator main body 4 and the rotation direction of the elliptic vibration by ultrasonic wave vibration at the position of the drive contact part 5 at the top of the vibrator main body 4 are opposite (see FIG. 4 described later).

FIGS. 4A and 4B show typical elliptic vibrations of the drive contact part of the vibrator caused when alternating voltages with different frequencies in the vicinity of a resonant frequency, whose phases are different by $\pi/2$ are applied.

FIGS. 4A and 4B show a combined drive contact part 37 obtained by combining the two drive contact parts 5. Although the locations of the drive contact parts 5 differ in the upper and lower sections, FIGS. 4A and 4B show them as a combined drive contact part 37 with the same reference numeral.

Even when the drive contact part 5 is a single drive contact part, the movement of the elliptic vibration described below is the same.

FIG. 4A shows the operation in the case where the phase of an alternating voltage to be applied to the phase A electrodes 22 and 23 is ahead of that applied to the phase B electrodes 24 and 35, by $\pi/2$. In this case, the drive contact part 5 at the bottom of the vibrator main body 4 rotates clockwise, while the drive contact part 5 at the top of the vibrator main body 4 rotates counter-clockwise.

FIG. 4B shows the operation in the case where the phase of an alternating voltage to be applied to the phase A electrodes 22 and 23 is behind that applied to the phase B electrodes 24 and 35, by $\pi/2$. In this case, the drive contact part 5 at the bottom of the vibrator main body 4 rotates counter-clockwise, while the drive contact part 5 at the top of the vibrator main body 4 rotates clockwise.

In this way, it is preferable to dispose the drive contact parts of a given vibrator in such a way as to rotate in the same direction and also to dispose the drive contact parts of the vibrator on the opposite side in such a way as to rotate in opposite directions.

Thus, the driving power of the member to be driven can be most efficiently obtained.

Specifically, elliptic vibration obtained by combining the vertical vibration and curvature vibration of the two vibrator main bodies act on the body to be driven 2 via the four drive contact parts 5, and the body to be driven 2 advances/retreats in the depth direction of FIG. 1A and moves in the left/right direction of FIG. 1B, as shown in FIGS. 1A and 1B, according to the guidance of the contact surface of each drive contact part of the vibrator main body 4. This is the operating principle of the vibration wave motor of the present invention.

Although in this preferred embodiment, the piezoelectric parts are formed in two places of phase A provided with phase A electrodes 22 and 23 and phase B provided with phase B electrodes 24 and 25, the number of places of the piezoelectric parts is not limited to two, and it can also be three or more as long as the vertical and curvature vibrations can be caused.

In this example, since the vibrator main body 4 is almost a rectangular parallelepiped, the above-described driving power can be obtained by vertical and curvature vibrations. However, if such a driving power can be obtained by causing elliptic vibration in the drive contact part, the vibrator can also assume another shape.

Almost the same vibrating movement can also be obtained by simultaneously exciting one or a plurality of the same or integrally multiple frequency modes.

Furthermore, it is preferable to provide the drive contact part in an arbitrary position where the highest-level output characteristic of a vibration wave linear motor can be obtained, specifically, in an arbitrary position where the highest-level ultrasonic elliptic vibration of the vibrator main body 4 occurs.

However, since elliptic vibration is the source of drive, one or more drive contact parts cause elliptic vibration. Therefore, it is sufficient if the drive contact parts are disposed in such a way that the sum of driving power due to vibration caused in at least all the drive contact parts does not become zero.

In this case, there is no need to cause an elliptic movement in all the vibrators. Even when it is a single vibration or there are opposite-direction vibrations, it is sufficient if the total driving power of all the vibrators is not zero and is directed in a specific direction.

In any of the cases, by appropriately setting the location of electrodes, application timing of alternating voltage and location of the drive contact part, the body to be driven 2 can be driven by a minimum input voltage, using two upper and lower vibrators.

The Second Preferred Embodiment

Figure 5A:
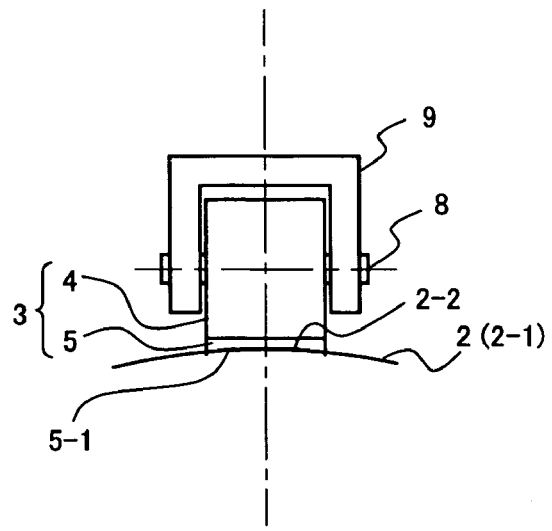
FIGS. 5A, 5B and 5C show that the shape of the outer surface of the body to be driven and that of the drive contact part are formed in such a way as to be reciprocally imitated in the second preferred embodiment.
Figure 5B:
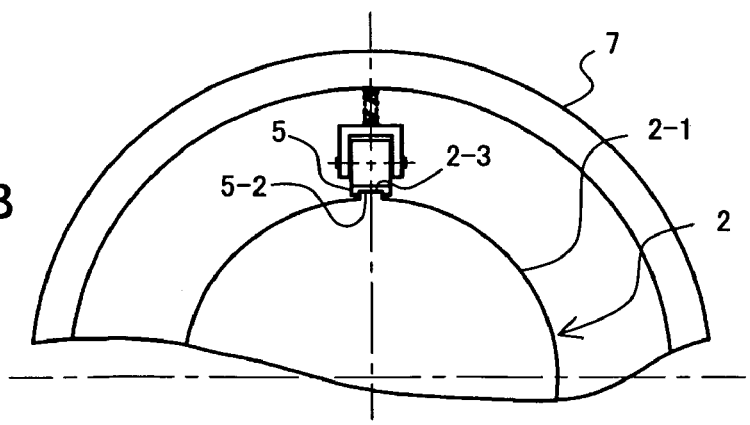
Figure 5C:
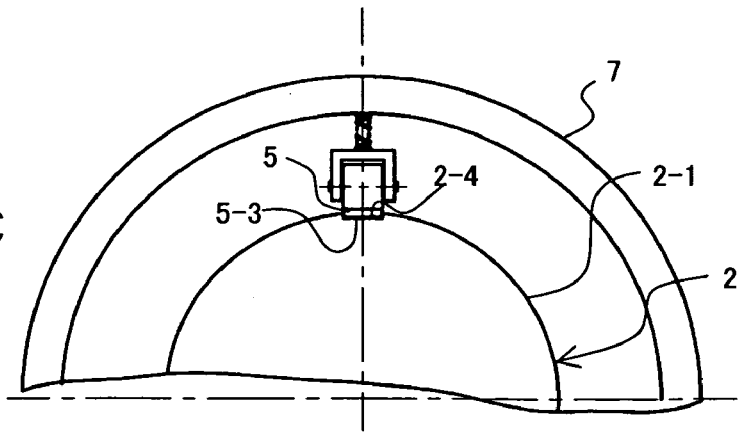

FIGS. 5A, 5B and 5C show that the shape of the outer surface of the body to be driven 2 and that of the drive contact part 5 are formed in such a way as to be reciprocally imitated in the second preferred embodiment.

In FIG. 5A, in the contact part between the outer surface 2-1 of the body to be driven 2 and the drive contact part 5 of the vibrator 4, the contact part of the outer surface 2-1 and the contact part of the drive contact part 5 are formed into a convex circular arc 2-2 and a concave circular arc 5-1, respectively, which are reciprocally imitated.

In FIG. 5B, in the contact part between the outer surface 2-1 of the body to be driven 2 and the drive contact part 5 of the vibrator 4, the contact part of the outer surface 2-1 and the contact part of the drive contact part 5 are formed into a sheer convex projection 2-3 and a sheer concave depression 5-2, respectively, which are externally fitted. In other words, they are also reciprocally imitated.

In FIG. 5C, conversely in FIG. 5B, the contact part of the outer surface 2-1 of the body to be driven 2 and the contact part of the drive contact part 5 are formed into a sheer concave depression 2-4 and a sheer convex projection 5-3, respectively, which are externally fitted. In other words, they are also reciprocally imitated.

In any of the cases, since the outer surface 2-1 of the body to be driven 2 and the drive contact part 5 are reciprocally imitated and engaged, as described with reference to FIGS. 1A and 1B, the body to be driven 2 and the vibrator 3 are reciprocally pressed and contacted, the body to be driven 2 is prohibited from rotating from the driving direction.

In the case of FIG. 5A, when the diameter of the body to be driven 2 is small, both contact parts become sharp circular arcs. Therefore, even in this form, the body to be driven 2 is prohibited from rotating from the driving direction. However, if the diameter of the body to be driven 2 is large, the shape shown in FIG. 5B or 5C is preferable.

Since as described above, the body to be driven 2 is prohibited from rotating from the driving direction, in these contact parts, the body to be driven 2 can be accurately driven in one direction only by the vibrator 3. The body to be driven 2 can be guided in its driving direction only by the vibrator 3.

The body to be driven 2 can be guided in its driving direction by even only one of a plurality of vibrators 3 provided with the drive contact part 5 imitated according to the contact part with the outer surface 2-1 of the body to be driven 2.

As described above, since according to this preferred embodiment, there is no need to provide another component for guiding the body to be driven 2, the entire device can be miniaturized.

The Third Preferred Embodiment

Figure 6:
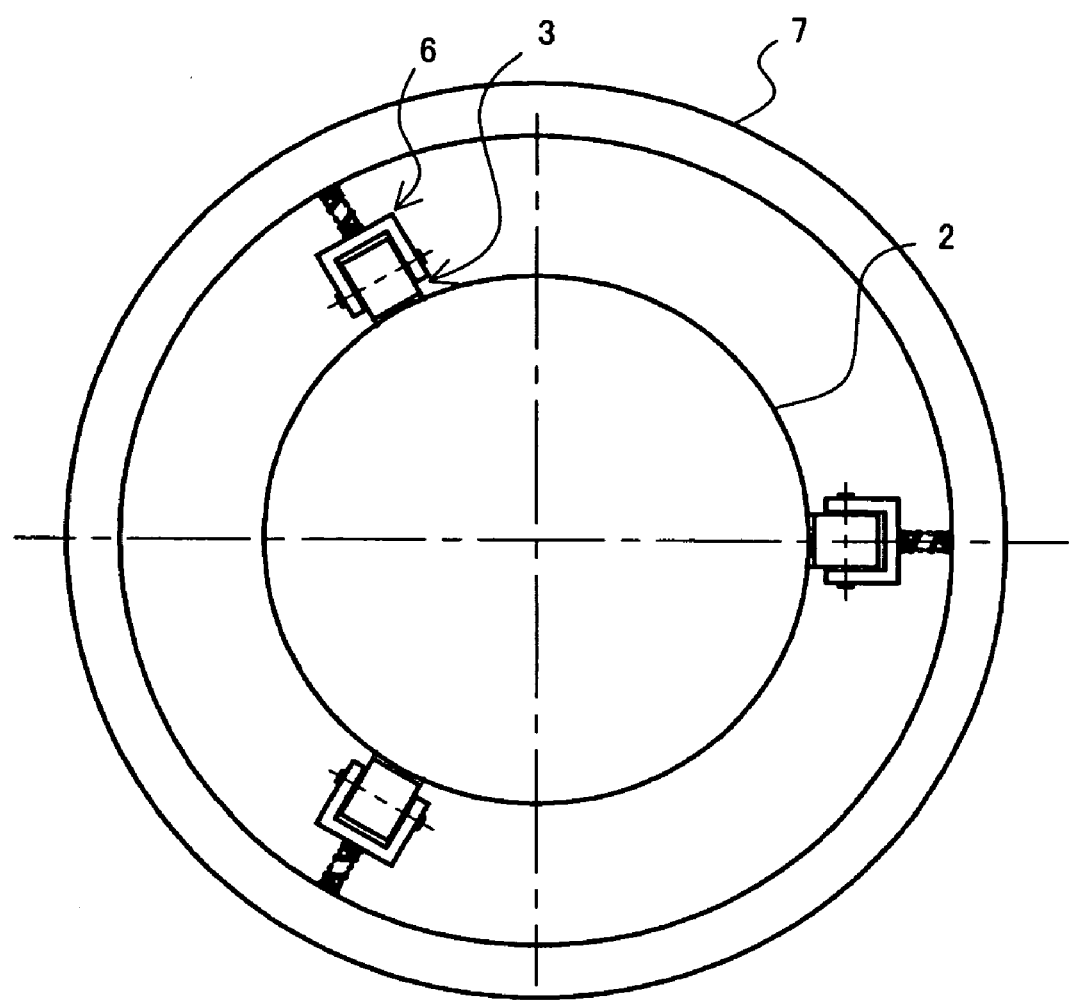
FIG. 6 shows an example of the structure in which three or more vibrators are disposed around the body to be driven as the third preferred embodiment.

FIG. 6 shows an example of the structure in which three or more (three in FIG. 6) vibrators are disposed around the body to be driven in the third preferred embodiment.

In FIG. 6, the pushing force in the direction of the body to be driven 2 which the vibrator 3 receives from the connecting part 6 is set to be uniform. Thus, the body to be driven 2 can keep its center inside of the base 7.

Specifically, by disposing at least three vibrators 3 around the body to be driven 2 at equal intervals, the body to be driven 2 can be kept at the center inside the base 7 only by the three vibrators and can be guided in the driving direction.

Therefore, its structure is simple, and also no guiding member is needed, thereby miniaturizing the device. Since this structure uses three or more vibrators 3, it increases driving power.

The Fourth Preferred Embodiment

Figure 7B:
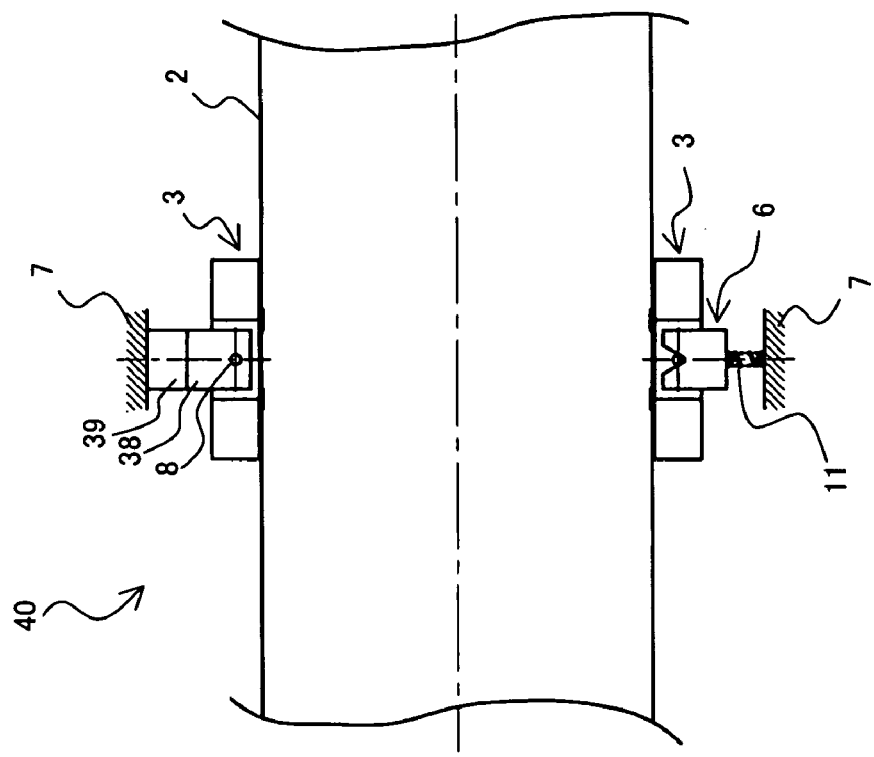
FIG. 7B is the side view of the vibration wave motor shown in FIG. 7A.
Figure 7A:
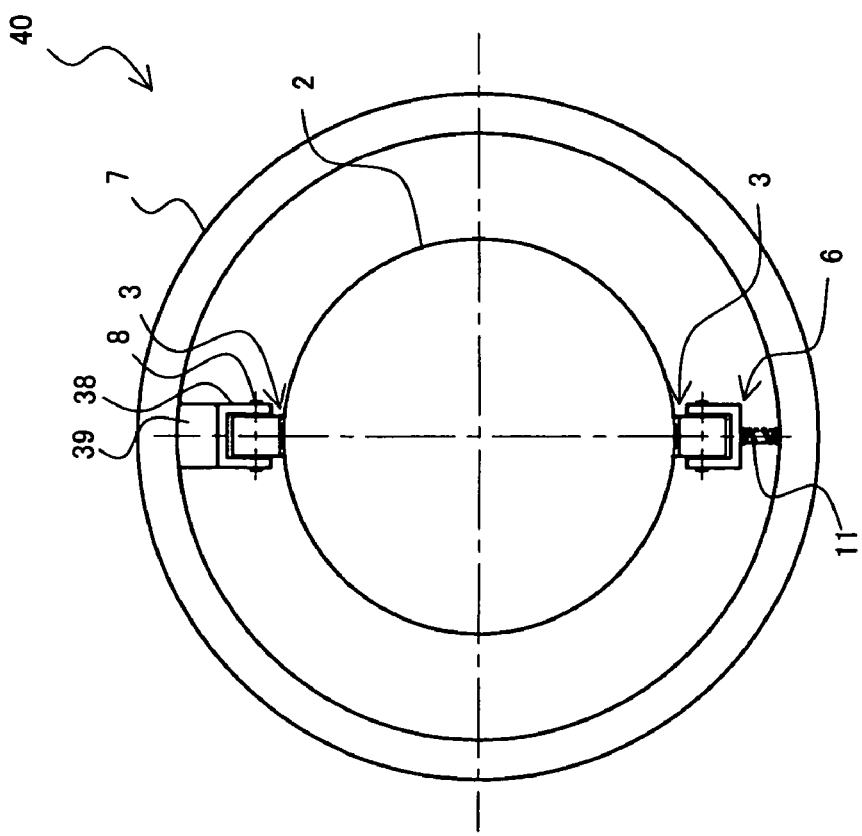
FIG. 7A is the front view of the vibration wave motor in the fourth preferred embodiment.

FIG. 7A is the front view of the vibration wave motor in the fourth preferred embodiment. FIG. 7B is its side view.

In the vibration wave motor 40 shown in FIG. 7A or 7B, the structure of the connecting part 6 of a vibrator 3 in contact with and pressed against the body to be driven 2 at the bottom is the same as in FIG. 1A or 1B. However, a holding member 38 constituting the connecting part 6 of the vibrator 3 reciprocally in contact with and pressed against the body to be driven 2 at the top is fixed on the base 7 via a fixed-interval maintaining member 39.

The body to be driven 2 is kept at the center inside the base 7 by pushing force applied by the connecting part 6 at the bottom via the vibrator 3 and the interval maintaining function of the fixed interval maintaining member 39 inserted between the holding member 38 of the upper vibrator 3 and the base 7.

The upper vibrator 3 is reciprocally in contact with and pressed against the body to be driven 2 by pushing force applied by the connecting part 6 at the bottom via the vibrator 3.

The upper vibrator 3 can guide the body to be driven 2 more accurately in a specific direction (driving direction) in cooperation with the reciprocal contact pressure by being fixed to the base 7 via the fixed interval maintaining member 39.

The upper vibrator 3 can also be directly fixed on the base 7 via the fixed interval maintaining member 39 on its top surface (a surface which is the opposite of a surface on which the drive contact part 5 is fixed), without the interposition of the holding member 38.

However, in that case, the length in the direction of the body to be driven 2 of the fixed interval maintaining member 39 must be set longer by the length of the holding member 38.

When one vibrator 3 is fixed on the base 7 in this way, the number of drive contact parts 5 of the vibrator 3 (the lower vibrator 3 in FIG. 7) located and fixed in such a way as to be freely moved by pushing member 11 in a position opposing this fixed vibrator 3 can also be only one if the drive contact part 5 of the free vibrator is disposed between the two drive contact parts of the vibrator fixed on the base 7.

Although in FIG. 7, one of two vibrators is fixed to the base 7, in this case, the number of vibrators is not limited. Even when three or more vibrators 3 are disposed around the body to be driven 2, one of them can also be fixed to the base 7.

If so, at least one vibrator 3 is fixed not to move freely. Therefore, the body to be driven 2 can be driven in the driving direction without tilting and guidance can be improved.

The Fifth Preferred Embodiment

FIG. 8A is the front view of the vibration wave motor in the fifth preferred embodiment. FIG. 8B is its side view.

The vibration wave motor 41 shown in FIGS. 8A and 8B comprises an annular body to be driven 42, a rotation-suspending guide pin 43 pierced through the body to be driven 42 and a rail part 44 provided and projecting from the outer circumference of the body to be driven 42.

The vibration wave motor 41 further comprises two vibrators 3 each of which is fixed to each of the bases 45 (45-1 and 45-2) and which vertically pinches the rail part 44 of the body to be driven 42.

The respective structures of the two vibrators and connecting parts 6 holding and supporting each vibrator are the same as those of vibrators 3 and connecting parts 6 shown in FIGS. 1A and 1B.

In this vibration wave motor 41, the base 45 and the body to be driven 42 are reciprocally driven linearly via the rail part 44 in a state where the longitudinal direction (the depth direction of the paper in FIG. 8A and left/right direction of the drawing in FIG. 8B) of each of the two vibrators and the longitudinal direction of the rail part 44 are matched.

The Sixth Preferred Embodiment

FIG. 9A is the front view of the vibration wave motor in the sixth preferred embodiment. FIG. 9B is its side view.

The vibration wave motor 46 shown in FIG. 9A or 9B firstly comprises an annular body to be driven 47.

This body to be driven 47 comprises a rail part 48 projecting from the outer circumference of the main body and convex lines 49 provided on the two opposing surfaces along the longitudinal direction (the depth direction of the paper in FIG. 9A and the left/right direction of the drawing in FIG. 9B) of the rail part.

The vibration wave motor 46 comprises two vibrators 3' each of which is connected to bases 51 (51-1 and 51-2) and is provided with a drive contact part 5' externally fit to each of the convex lines 49 of the rail part 48 of the body to be driven 47.

In the vibration wave motor 46, the base 51 and body to be driven 47 are reciprocally driven linearly by the two vibrators 3' via the rail part 48, in a state where the longitudinal direction (the depth direction of the paper in FIG. 9A and the left/right direction of the drawing in FIG. 9B) of each of the two vibrators 3' and the longitudinal direction of the convex line match.

Since driving is performed in a state where the drive contact parts 5' of the two vibrators 3' are externally fit in the convex lines of the rail part 48 in this way, a specific driving direction is maintained.

Therefore, in this case, no rotation suspending pin pierced through the body to be driven 47, as shown in FIG. 8A is needed.

In the sixth preferre3d embodiment also, since the vibrators 3' are disposed on the rail part 48, there is no need to provide a base in such a way as to surround the outer circumference of the body to be driven 47, which is effective in the miniaturization of the entire device.

The convex line 49 of the rail part 48 is not limited to this form, and it can be a groove. In that case, a convex part formed in the drive contact part of a vibrator can also be externally fit into this groove.

The Seventh Preferred Embodiment

FIG. 10A is the front view of the vibration wave motor in the seventh preferred embodiment. FIG. 10B is its side view.

As shown in FIGS. 10A and 10B, this vibration wave motor 52 firstly comprises an annular body to be driven 53.

A guide shaft 54 is inserted into this body to be driven 53, and a projecting part with a groove 55 is provided in a position opposite to the insertion position of this guide shaft 54. Then, a rotation-suspending shaft 57 is engaged with the groove 56 of this projecting part with a groove 55.

The vibrator 3 connected to an annular base 58 surrounding the body to be driven 53 via a connecting part 6 which is in contact with and pressed against the vertical outer circumference surface perpendicular to a horizontal plane connecting the piercing part of the guide shaft 54 and the rotation suspending shaft 57 engaged with the groove 56 of the body to be driven 53.

This vibration wave motor 52 is set in such a way that the sum of the pushing vectors applied to the body to be driven 53 of the two vibrators becomes zero, and that the frictional force between the body to be driven 53 and the guide shaft 54 and the rotation-suspending shaft 57 do not exceed the driving power of the two vibrators.

In this vibration wave motor 52, the two vibrators reciprocally drive the base 58 and the body to be driven 53 linearly in a state where the longitudinal direction of each of the two vibrators and the longitudinal direction of the body to be driven 53 are matched.

Since in the above-described structure, the body to be driven 53 is provided with the guide shaft 54, there is no need to modify the shape of the drive contact part 5 of the vibrator 3 in such a way as to guide the body to be driven 53 (see FIGS. 5A, 5B and 5C).

Thus, since the vibration wave motor 52 of this preferred embodiment can guide the body to be driven 53 in the driving direction with a simple structure, the entire device can be miniaturized.

The Eighth Preferred Embodiment

FIG. 11A is the front view of the vibration wave motor in the eighth preferred embodiment. FIG. 11B is its side view.

As shown in FIGS. 11A and 11B, this vibration wave motor 60 comprises an annular body to be driven 61 with a fairly large diameter, and an annular base 62 with a fairly small diameter is provided centered inside this body to be driven 61.

Two vibrators 3 connected to the outer surface of the base 62 in a position where the vibrators are opposed via the connecting part 6 are in contact with and pressed against the inner surface of the body to be driven 61.

In the annular base 62, wiring for supplying the vibrator 3 with a driving voltage is laid through its hollow part.

In this vibration wave motor 60, the two vibrators reciprocally drive the base 62 and the body to be driven 61 linearly in a state where the longitudinal direction of each of the two vibrators and the longitudinal direction of the body to be driven 61 are matched.

As shown in FIGS. 7A and 7B, either of the vibrators 3 can also be fixed to the base, and the other can be disposed in such a way as to freely move. Three or more vibrators 3 can also be disposed at equal intervals.

In any of the cases, the body to be driven 61 is positioned and is guided in the driving direction by the pushing force applied to the body to be driven by the vibrator 3. Therefore, in the structure of this preferred embodiment, no guide member is needed, thereby miniaturizing the device.

FIG. 12A is the front view of the vibration wave motor in a variation of the eighth preferred embodiment. FIG. 12B is its side view.

In this preferred embodiment, instead of the annular base 62 as shown in FIGS. 11A and 11B, a rail-shaped base 63 with a rectangular section is disposed inside the body to be driven, and the vibrator 3 is connected to a surface constituting the short side of the rail-shaped base 63 where their sections are opposed via the connecting part 6.

Wiring for supplying the vibrator 3 with driving voltage can be laid along the surface of the base 63 where no vibrators are disposed.

As described above, according to the first through fourth preferred embodiments, the vibrator 3 can be miniaturized compared with the size of the body to be driven since a plurality of driving vibrators are disposed between a base and the body to be driven. Therefore, the entire device can be miniaturized.

Since one of the plurality of vibrators is fixed on the base and the vibrator guides the body to be driven, the body to be driven never tilts and can be reciprocally driven in one direction.

According to the first, second or fourth preferred embodiment, sometimes the driving part also acts as a guide part, no special guide component is needed, thereby miniaturizing the device.

What is claimed is:

1. A vibration wave motor, comprising:
   a body to be driven comprising a rotation suspending guide pin pierced through the body and a rail part projecting from its outer circumference surface;
   two vibrators each of which is connected to a base and which are disposed in such a way as to pinch the rail part of the body to be driven,
   wherein the base and the body to be driven are reciprocally driven linearly in a state where a longitudinal direction of the vibrator and a driving direction of the body to be driven are matched.

2. A vibration wave motor, comprising:
   a body to be driven comprising a rail part projecting from its outer circumference surface and convex lines each of which is provided on each of two surfaces opposing the rail part along the longitudinal direction of the rail part;
   two vibrators each comprising a drive contact part which is connected to a base and is externally fitted over the convex line of the rail part of the body to be driven,
   wherein the base and the body to be driven are reciprocally driven linearly in a state where a longitudinal direction of the vibrator and a driving direction of the body to be driven are matched.

* * * * *